United States Patent
Liu et al.

(10) Patent No.: US 7,719,442 B2
(45) Date of Patent: May 18, 2010

(54) MULTI-MODE MULTI-PARALLELISM DATA EXCHANGE METHOD AND DEVICE THEREOF

(75) Inventors: Chih-Hao Liu, Sindian (TW); Chien-Ching Lin, Shueishang Township, Chiayi County (TW); Chen-Yi Lee, Hsinchu (TW); Hsie-Chia Chang, Keelung (TW); Yarsun Hsu, Jhonghe (TW)

(73) Assignee: National Chiao Tung University, Hsinchu (TW)

( * ) Notice: Subject to any disclaimer, the term of this patent is extended or adjusted under 35 U.S.C. 154(b) by 308 days.

(21) Appl. No.: 12/048,101

(22) Filed: Mar. 13, 2008

(65) Prior Publication Data

US 2009/0146849 A1 Jun. 11, 2009

(30) Foreign Application Priority Data

Dec. 7, 2007 (TW) .............................. 96146695 A

(51) Int. Cl.
   *H03M 7/34* (2006.01)
(52) U.S. Cl. .............................. 341/51; 341/60; 341/67; 341/95; 375/246; 375/254; 375/265; 375/355; 375/365
(58) Field of Classification Search ........... 341/50–107; 375/246, 265, 354, 355, 365, 368
   See application file for complete search history.

(56) References Cited

U.S. PATENT DOCUMENTS 5,262,974 A * 11/1993 Hausman et al. ............ 708/493
6,334,204 B1 * 12/2001 Suh ............................. 714/801
6,938,196 B2   8/2005 Richardson
6,957,375 B2  10/2005 Richardson
7,054,401 B2 *  5/2006 Kada et al. .................. 375/355
7,295,139 B2 * 11/2007 Fujisawa ..................... 341/100
7,317,720 B2 *  1/2008 Kamimura et al. .......... 370/366
7,318,186 B2 *  1/2008 Yokokawa et al. .......... 714/758

(Continued)

OTHER PUBLICATIONS

Se-Hyeon Kang & In-Cheol Park, Loosely Coupled Memory-Based Decoding Architecture for Low Density Parity Check Codes, IEEE Transactions on Circuits and Systems, May 2006,p. 1045-1056, vol. 53, No. 5.

(Continued)

*Primary Examiner*—Linh V Nguyen
(74) *Attorney, Agent, or Firm*—Muncy, Geissler, Olds, & Lowe, PLLC

(57) ABSTRACT

A multi-mode multi-parallelism data exchange method and the device thereof are proposed to apply to a check node operator or a bit node operator. The proposed method comprises the steps of: duplicating part or all of an original shift data as a duplicated shift data; combining the original shift data and the duplicated shift data to form a data block; and using a data block as the unit to shift this data block so as to conveniently retrieve shift data from the shifted data block. With a maximum z factor circuit and duplication of part of data, specifications of different shift sizes can be supported. The functions of shifters of several sizes can therefore be accomplished with the minimum complexity.

18 Claims, 5 Drawing Sheets

U.S. PATENT DOCUMENTS

| | | | | |
|---|---|---|---|---|
| 7,349,478 B2* | 3/2008 | Lakkis | ................. | 375/240.27 |
| 7,607,075 B2* | 10/2009 | Blankenship et al. | ....... | 714/800 |
| 2005/0283703 A1* | 12/2005 | Urard et al. | ................. | 714/752 |
| 2006/0206778 A1* | 9/2006 | Wehn et al. | ................. | 714/758 |
| 2008/0107199 A1* | 5/2008 | Lakkis | ....................... | 375/260 |
| 2008/0140686 A1* | 6/2008 | Hong et al. | ................. | 707/100 |
| 2009/0249159 A1* | 10/2009 | Lee et al. | .................... | 714/752 |

OTHER PUBLICATIONS

M. M. Mansour & N. R. Shanbhag, A 640-Mb/s 2048-Bit Programmable LDPC Decoder Chip, IEEE Journal of Solid-State Circuits, Mar. 2006, p. 684-698, vol. 41, No. 3.

Jun Tang, Bhatt T. Sundaramurthy V. & Keshab K. Parhi, Reconfigurable Shuffle Network Design in LDPC Decoders, Application-specific Systems, Architecture and Processors, 2006 (ASAP'06), p. 81-86.

* cited by examiner

| first original shift data 1st ~(z-1)th | first duplicated shift data 1st ~(z/2-1)th | First dummy data | second original shift data 1st ~(z-1)th | second duplicated shift data 1st~ (z/2-1)th | second dummy data |

FIG.3(a)

| First dummy data | first duplicated shift data (z/2)th~ (z-1)th | first original shift data 1st~ (z-1)th | second dummy data | second duplicated shift data (z/2)th~ (z-1)th | second original shift data 1st~ (z-1)th |

FIG.3(b)

MULTI-MODE MULTI-PARALLELISM DATA EXCHANGE METHOD AND DEVICE THEREOF

BACKGROUND OF THE INVENTION

1. Field of the Invention

The present invention relates to a low density parity check (LDPC) decoding technique applied in channel coding and, more particularly, to a multi-mode multi-parallelism data exchange method applied to communication systems and the device thereof.

2. Description of Related Art

Because low density parity check (LDPC) code has a powerful decoding performance close to the Shannon limit and has a characteristic of low complexity in the decoding process, it has been more and more employed in recent years, and has been widely used in many different communication applications.

The LDPC code is one kind of block codes, and defines a parity check matrix to systematically generate code words and also regulates the relationship between message bits. In algorithm, the LDPC decoding is one that transmits messages, and utilizes different algorithm to perform message reliability exchange between check node and bit node. In hardware realization, this algorithm needs to use memory for storing exchanged messages, and the required amount of memory depends on the number of 1's in the H matrix. In other words, the larger the length or the size of the H matrix, the more the required amount of memory.

Especially, in an LDPC decoder, random and large amount of message exchanges between operands cause much difficulty in realization. The quasi-cyclic LDPC coding simplifies message exchange into data shift, and therefore accomplishes a better way of circuit realization. In a quasi-cyclic LDPC decoder, shift circuits can be used for data exchange between bit node and check node because of the simplified parity check matrix. Therefore, when the length of the quasi-cyclic LDPC coding is large, in order to achieve higher data processing speed, a considerable number of shift circuits are required for data exchange actions. Because existent communication specifications need to support circuits of different shift sizes, it is possibly necessary to provide one shift circuit for each specific shift size. Moreover, because existent communication specifications have also to support different multi-mode shift sizes and multi-rate shift circuits, the shift size or hardware circuit control complexity of the quasi-cyclic coding will increase substantially, and the critical path delay of hardware circuit will increase at the same time. Besides, an ordinary shift circuit can only perform shift and exchange of a piece of data each time. Therefore, the decoding speed of the LDPC decoder cannot be enhanced for small exchange size.

A quasi-cyclic LDPC decoder requires a highly flexible shift device to provide the functions of shifters of different sizes. Accordingly, the present invention aims to provide a multi-mode multi-parallelism data exchange method and the method thereof to improve the above problems in the prior art.

SUMMARY OF THE INVENTION

An object of the present invention is to provide a multi-mode multi-parallelism data exchange method and the device thereof, which makes use of a maximum z factor circuit and duplication of part of data to support specifications of different shift sizes and also reduce the complexity of shift circuit.

Another object of the present invention is to provide a multi-mode multi-parallelism data exchange method and the device thereof, which can enhance the parallelism of different shift sizes, and can substantially enhance data exchange and decoding speed of the LDPC decoding device at small shift size by using the same set of hardware circuit.

In order to achieve the above objects, the present invention provides a multi-mode multi-parallelism data exchange method, which comprises the steps of: selecting a first number of original shift data, duplicating part or all of the original shift data as a duplicated shift data, and combining the original shift data and the duplicated shift data to form a data block of a length larger than the first number; shifting the data block; and retrieving shift data from the shifted data block.

A dummy data is further provided in the above data block.

The present invention also provides a multi-mode multi-parallelism data exchange device, which comprises at least one multi-mode multi-size shift unit that can apply to a check node operator or a bit node operator. This multi-mode multi-size shift unit contains a combined data block. The combined data block has one or more data blocks. Each data block includes a first number of original shift data and a duplicated shift data duplicating part or all of the original shift data. A data block can be used as the unit for performing shift operation and retrieving shift data.

BRIEF DESCRIPTION OF THE DRAWINGS

The various objects and advantages of the present invention will be more readily understood from the following detailed description when read in conjunction with the appended drawing, in which:

FIG. 3(a) is a diagram of a combined data block with a small shift size of the present invention; and FIG. 3(b) is a diagram of a combined data block with a large shift size of the present invention.

DETAILED DESCRIPTION OF THE PREFERRED EMBODIMENTS

Figure 1:
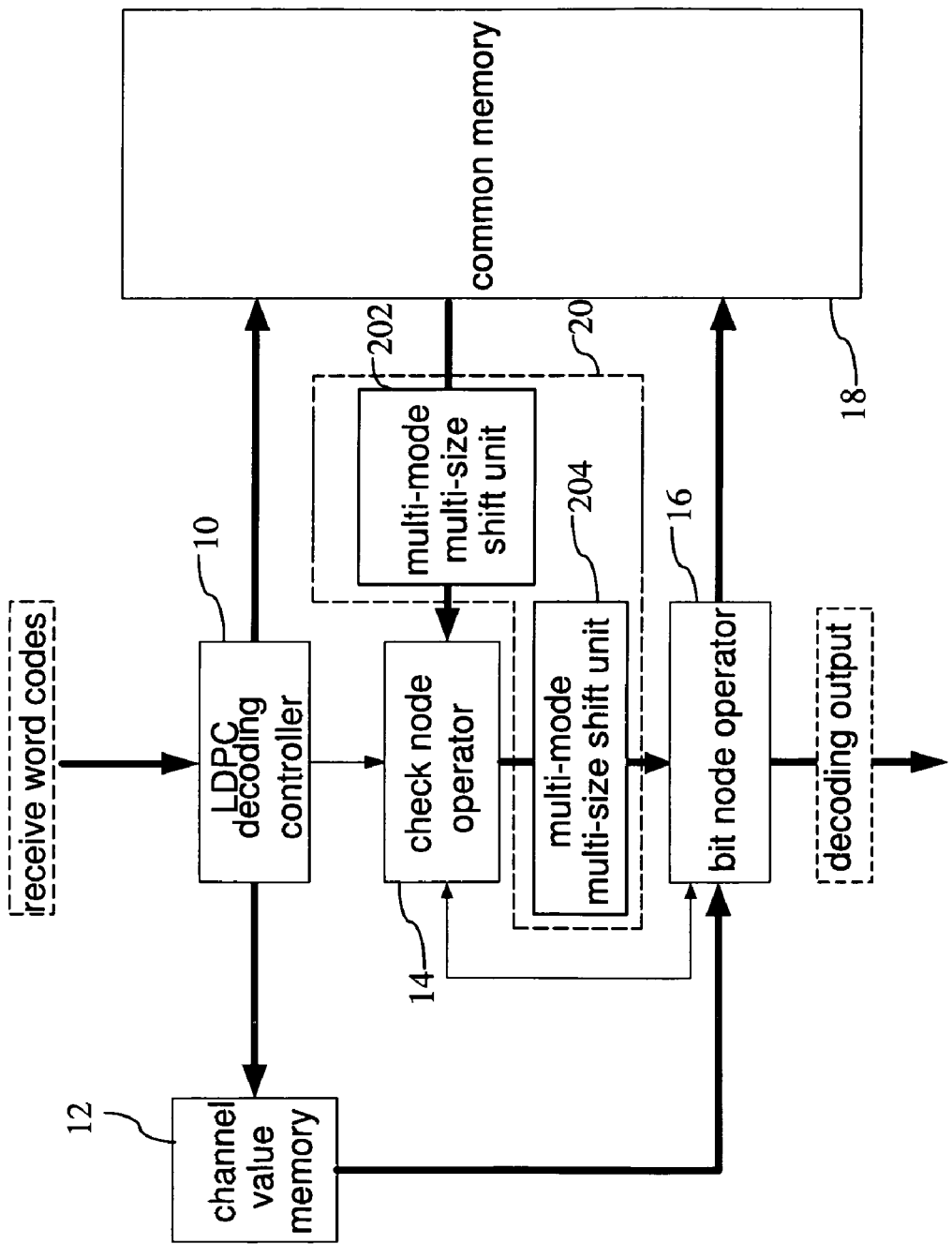
FIG. 1 is an architecture diagram of an LDPC decoder of the present invention.

The LDPC is a high-efficiency high-speed channel coding method, and will be widely used when the data communication rate reaches Gb/s in the future. The LDPC decoding includes primarily two operations: bit node and check node, and exchanges information after operation between bit node and check node. In the quasi-cyclic LDPC, because the algorithm has a high parallelism, decoding speed of Gb/s can be easily achieved. The quasi-cyclic LDPC, however, uses more and more shift circuits for data exchange, and has to support specifications of different shift sizes. Therefore, the present invention proposes a new method and device. With a shift circuit based on the maximum z factor collocated with duplication of part of data, any shift within any expected z factor can be accomplished. Therefore, specifications of different shift sizes can be supported, the complexity of shift circuit can be reduced, and the parallelism of different shift sizes can also be enhanced. By using the same set of hardware circuit, data exchange and decoding speed of the LDPC decoding device can be substantially enhanced at small shift size FIG. 1 is an architecture diagram of an LDPC decoder of the present invention. As shown in FIG. 1, the LDPC decoder comprises an LDPC decoding controller 10, which can receive input channel values and store the input channel values into a channel value memory 12. The LDPC decoder also comprises a check node operator 14 and a bit node operator 16. Values after operation of the check node operator 14 and the bit node operator 16 are stored in a common memory 18. The check node operator 14 can access the common memory 18 via a multi-mode multi-size shift unit 202 in a multi-mode multi-parallelism data exchange device 20. Message exchange between the check node operator 14 and the bit node operator 16 is performed via another multi-mode multi-size shift unit 204. All the above components are controlled by the LDPC decoding controller 10.

The multi-mode multi-parallelism data exchange method of the present invention is used in the above multi-mode multi-size shift units 202 and 204. This method comprises the following steps. A first number of original shift data are selected, part or all of the original shift data are duplicated as a duplicated shift data, and the original shift data and the duplicated shift data are combined to form a data block of a length larger than the first number. Of course, a second number of a plurality of data blocks can further form a combined data block. Next, data shift is performed with a data block as the unit no matter the data block is a single data block or the combined data block. Finally, after the shift operation is finished, expected shift data can be retrieved from the shifted data block. A dummy data can be properly added in the data block according to practical situation to separate different data blocks or for data duplication.

Besides, in high speed applications, if the second number is M, the combined data block has M sets of different combined data, in which the shift operation can be simultaneously performed and expected shift data can be retrieved. When the total length of the M sets of different combined data is larger than or equal to the shift size, this multi-mode multi-size shift device can be used to simultaneously finish M sets of data shift.

After technical features of the present invention have been illustrated above, the spirit of the present invention will be exemplified below with different embodiments for different situations.

Figure 2A:
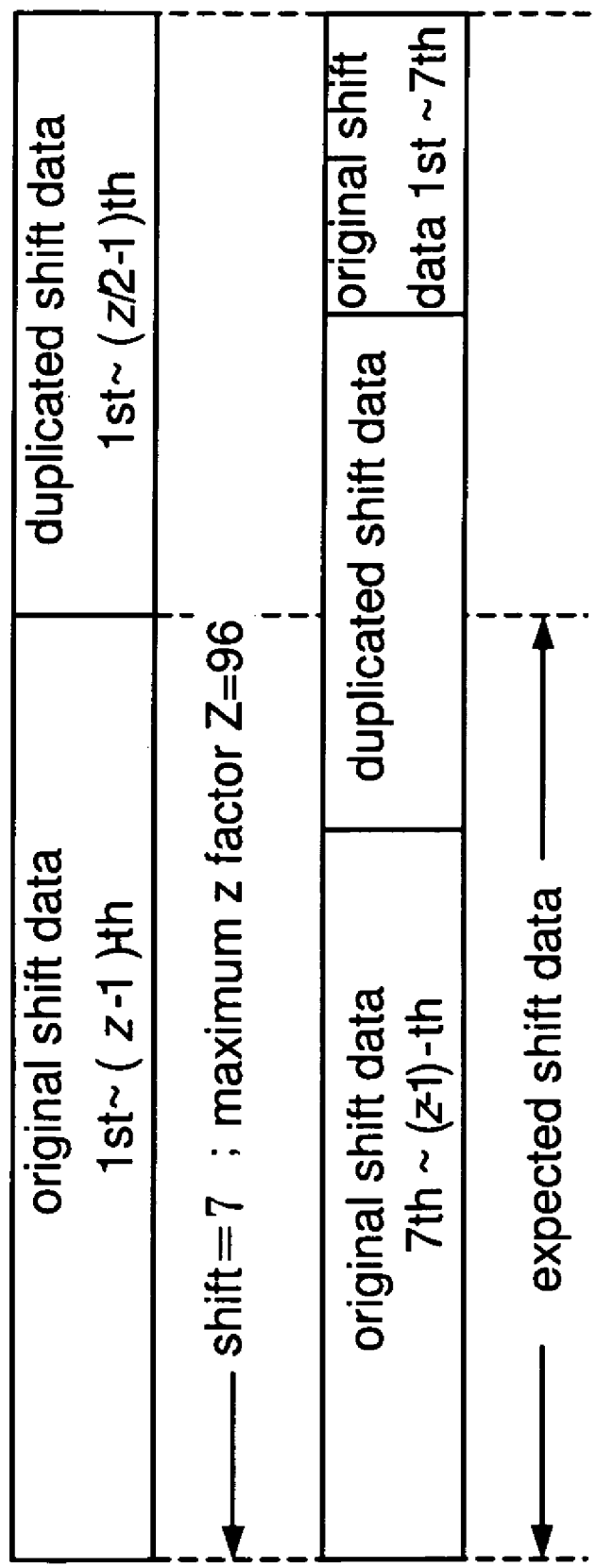
FIG. 2(a) is a diagram of a data block with a small shift size of the present invention.

As shown in FIG. 2(a), in a multi-mode multi-size shift unit, if the expected z factor in a data block is smaller than or equal to a half of the maximum z factor, the original shift data $1^{st}$~$(z-1)$th is located at the front part of the data block, and the duplicated shift data formed by duplicating the front half of the original shift data $1^{st}$~$(z/2-1)$th is arranged at the rear part of the data block. The amount ratio of the original shift data and the duplicated shift data is 2:1. For example, when the maximum z factor is 96 and the expected z factor is 7, in the data block, the original shift data is shifted to become $7^{th}$~$(z-1)$th, the duplicated shift data is forward-shifted by 7 and is still $1^{st}$~$(z/2-1)$th. In the expected shift data, the original shift data $7^{th}$~$(z-1)$th and the duplicated shift data $1^{st}$~$7^{th}$ are still preserved.

Figure 2B:
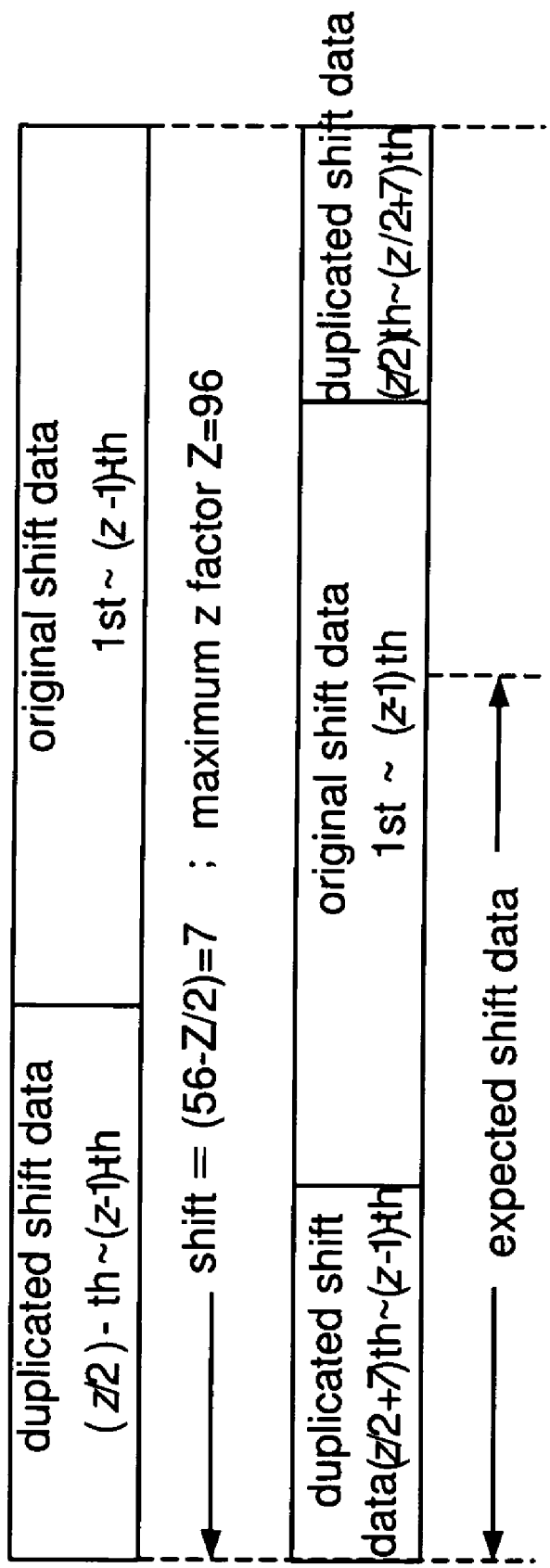
FIG. 2(b) is a diagram of a data block with a large shift size of the present invention.

On the other hand, as shown in FIG. 2(b), if the expected z factor in a data block is larger than a half of the maximum z factor, the original shift data $1^{st}$~$(z-1)$th is located at the rear part of the data block, and the duplicated shift data formed by duplicating the rear half of the original shift data $(z/2)$th~$(z-1)$th is arranged at the front part of the data block. The amount ratio of the original shift data and the duplicated shift data is also 2:1. For example, when the maximum z factor is 96 and the expected z factor is 72, in the data block, because the duplicated shift data is located at the front part of the data block, the shift can be converted to $(56-z/2)=7$. The duplicated shift data is shifted to become $(z/2+7)$th~$(z-1)$th, the original shift data is forward-shifted by 7 and is still $1^{st}$~$(z-1)$th. In the expected shift data, the duplicated shift data $(z/2+7)$th~$(z-1)$th and the original shift data $1^{st}$~$(z-8)$th are still preserved.

In the above two embodiments, the exchange operation of data shift of only one data block is performed in the multi-mode multi-size shift unit. Parallel processing of several data blocks (forming a combined data block) can also be simultaneously performed in the same multi-mode multi-size shift unit.

First, using the mode with a parallelism of 2 as the example, if the expected z factor in a data block is smaller than or equal to a half of the maximum z factor, as shown in FIG. 3(a), the whole combined data block contains two data blocks. The first data block includes in order from the front to back a first original shift data $1^{st}$~$(z-1)$th, a first duplicated shift data that duplicates the front half of the first original shift data $1^{st}$~$(z/2-1)$th, and a first dummy data. In the same arrangement manner, the second data block includes in order from the front to back a second original shift data $1^{st}$~$(z-1)$th, a second duplicated shift data that duplicates the front half of the second original shift data $1^{st}$~$(z/2-1)$th, and a second dummy data. Although there are two data blocks in this embodiment, the shift and exchange operations are separately performed with each data block as the unit. Therefore, the actions are the same as those in the above embodiment of FIG. 2(a) and thus won't be further described.

If the expected z factor in a data block is larger than a half of the maximum z factor, as shown in FIG. 3(b), the whole combined data block also contains two data blocks. The first data block includes in order from the front to back a first dummy data, a first duplicated shift data that duplicates the rear half of a first original shift data $(z/2)$th~$(z-1)$th, and the first original shift data $1^{st}$~$(z-1)$th. In the same arrangement manner, the second data block includes in order from the front to back a second dummy data, a second duplicated shift data that duplicates the rear half of a second original shift data $(z/2)$th~$(z-1)$th, and the second original shift data $1^{st}$~$(z-1)$th. Although there are two data blocks in this embodiment, the shift and exchange operations are separately performed with each data block as the unit. Therefore, the actions are the same as those in the above embodiment of FIG. 2(b) and thus won't be further described.

In the above mode with a parallelism of 2, the present invention has also to consider whether the shift is smaller than or equal to a half of the expected z factor. In the above two embodiments shown in FIGS. 3(a) and 3(b), both the data shifts are smaller than or equal to a half of the expected z factor. Of course, the shifts of the two pieces of data may differ much. For instance, the shift of the first piece of data is smaller than or equal to a half of the expected z factor, while the shift of the second piece of data is larger than a half of the expected z factor. Therefore, when the parallelism is 2, in order to shift two pieces of data, it is necessary to allocate one 2×1 multiplexer for each piece of data to determine whether to duplicate the front half or the rear half of data. In other words, because the shift of the first piece of data is smaller than or equal to a half of the expected z factor, the front half of data is duplicated; and because the shift of the second piece of data is larger than a half of the expected z factor, the rear half of data is duplicated.

The above embodiment is exemplified by using the mode with a parallelism of 2. Modes with parallelism of 3, 4 and even M also adopt the same manner. It is only necessary to adjust the number of data blocks to accomplish multi-parallelism shift exchange. If the parallelism is larger than 2, the maximum z factor should be divided by 3, 4 or M to keep the maximum total shift size constant when determining the shift size. It is not necessary to design different shift circuits to cope with different shift sizes as in the prior art.

To sum up, the present invention can use a shift circuit based on the maximum z factor to achieve any shift within any expected z factor. With a maximum z factor circuit and duplication of part of data, specifications of different shift sizes can be supported, the parallelism of different shift sizes can be enhanced, and the complexity of shift circuit can also be reduced at the same time. Therefore, the present invention only needs to use the same set of hardware circuit to substantially enhance the data exchange and decoding speed of the LDPC decoding device at small shift size.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

We claim:

1. A multi-mode multi-parallelism data exchange method comprising the steps of:
   selecting a first number of original shift data, duplicating part or all of said original shift data as a duplicated shift data, and combining said original shift data and said duplicated shift data to form a data block of a length larger than said first number;
   shifting said data block; and
   retrieving shift data from said shifted data block.

2. The multi-mode multi-parallelism data exchange method as claimed in claim 1, wherein said data block is located in a multi-mode multi-size shift unit.

3. The multi-mode multi-parallelism data exchange method as claimed in claim 2, wherein said data block provides a check node operator or a bit node operator for use.

4. The multi-mode multi-parallelism data exchange method as claimed in claim 1 further comprising a combined data block composed of a second number of said data block.

5. The multi-mode multi-parallelism data exchange method as claimed in claim 4, wherein all of said data block in said combined data block is simultaneously shifted to retrieve respective shift data in said step of shifting said data block.

6. The multi-mode multi-parallelism data exchange method as claimed in claim 1, wherein a dummy data is further provided in said data block to separate different data blocks.

7. The multi-mode multi-parallelism data exchange method as claimed in claim 6, wherein said dummy data is located behind said duplicated shift data.

8. The multi-mode multi-parallelism data exchange method as claimed in claim 1, wherein a number ratio of said original shift data and said duplicated shift data is 2:1.

9. The multi-mode multi-parallelism data exchange method as claimed in claim 1, wherein if a expected z factor is smaller than or equal to a half of a maximum z factor in said data block, said original shift data is located at a front part of said data block, and said duplicated shift data is located at a rear part of said data block, and said duplicated shift data is a copy of the front half of said original shift data.

10. The multi-mode multi-parallelism data exchange method as claimed in claim 1, wherein if a expected z factor is larger than a maximum z factor in said data block, said original shift data is located at a rear part of said data block, and said duplicated shift data is located at a front part of said data block, and said duplicated shift data is a copy of the rear half of said original shift data.

11. A multi-mode multi-parallelism data exchange device comprising:
    at least one multi-mode multi-size shift unit containing a combined data block, said combined data block having at least one data block, each said data block including a first number of original shift data and a duplicated shift data duplicating part or all of said original shift data, said data block being used as the unit for performing shift operation and retrieving shift data.

12. The multi-mode multi-parallelism data exchange device as claimed in claim 11, wherein said multi-mode multi-size shift unit provides a check node operator or a bit node operator for use.

13. The multi-mode multi-parallelism data exchange device as claimed in claim 11, wherein when said combined data block is composed of a second number of said data block, all of said block data in said combined data block is simultaneously shifted to retrieve respective shift data.

14. The multi-mode multi-parallelism data exchange device as claimed in claim 11, wherein a dummy data is further provided in said data block to separate different data blocks.

15. The multi-mode multi-parallelism data exchange device as claimed in claim 14, wherein said dummy data is located behind said duplicated shift data.

16. The multi-mode multi-parallelism data exchange device as claimed in claim 11, wherein a number ratio of said original shift data and said duplicated shift data is 2 to 1.

17. The multi-mode multi-parallelism data exchange device as claimed in claim 11, wherein if a expected z factor is smaller than or equal to a half of a maximum z factor in said data block, said original shift data is located at a front part of said data block, and said duplicated shift data is located at a rear part of said data block, and said duplicated shift data is a copy of the front half of said original shift data.

18. The multi-mode multi-parallelism data exchange device as claimed in claim 11, wherein if a expected z factor is larger than a maximum z factor in said data block, said original shift data is located at a rear part of said data block, and said duplicated shift data is located at a front part of said data block, and said duplicated shift data is a copy of the rear half of said original shift data.

* * * * *